(12) United States Patent
Zhang et al.

(10) Patent No.: US 11,456,221 B2
(45) Date of Patent: Sep. 27, 2022

(54) METHOD FOR MEASURING CHIPS BONDING STRENGTH AND CHIPS BONDING AUXILIARY STRUCTURE

(71) Applicant: UNITED MICROELECTRONICS CORP., Hsinchu (TW)

(72) Inventors: Sheng Zhang, Singapore (SG); Chien-Kee Pang, Singapore (SG); Xin Zhao, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 188 days.

(21) Appl. No.: 16/906,330

(22) Filed: Jun. 19, 2020

(65) Prior Publication Data
US 2021/0358818 A1 Nov. 18, 2021

(30) Foreign Application Priority Data

May 12, 2020 (CN) .......................... 202010396124.1

(51) Int. Cl.
*H01L 21/66* (2006.01)
(52) U.S. Cl.
CPC ............. *H01L 22/12* (2013.01); *H01L 22/30* (2013.01)
(58) Field of Classification Search
CPC ......... H01L 22/12; H01L 22/30; H01L 22/20; H01L 23/544; H01L 2223/544; G01N 19/04

USPC ........................................................ 438/14
See application file for complete search history.

(56) References Cited

U.S. PATENT DOCUMENTS

| 5,323,952 | A | 6/1994 | Kato et al. | |
|---|---|---|---|---|
| 7,612,895 | B2 | 11/2009 | Gabriel et al. | |
| 2006/0012037 | A1* | 1/2006 | Raedt | H01L 24/94 257/E21.705 |
| 2008/0285059 | A1* | 11/2008 | Gabriel | H01L 22/14 257/E21.531 |
| 2015/0091159 | A1* | 4/2015 | Tsai | H01L 23/49811 257/737 |
| 2018/0369862 | A1* | 12/2018 | Alie | B06B 1/0292 |

FOREIGN PATENT DOCUMENTS

| CA | 2611381 | * 12/2006 |
|---|---|---|
| CN | 102175603 | 12/2012 |
| JP | 2007225471 | * 9/2007 |
| JP | 2008177329 | * 7/2008 |

\* cited by examiner

*Primary Examiner* — Duy T Nguyen
(74) *Attorney, Agent, or Firm* — WPAT, PC

(57) ABSTRACT

A method for measuring chips bonding strength includes steps as follows: An auxiliary pattern is formed on a first surface of a first chip. A second surface of a second chip is bonded to the first surface to form at least one gap space surrounding the auxiliary pattern. Next, dimensions of the at least one gap space and the auxiliary pattern are measure respectively; and the bonding strength between the first chip and the second chip is estimated according to the dimensions.

12 Claims, 7 Drawing Sheets

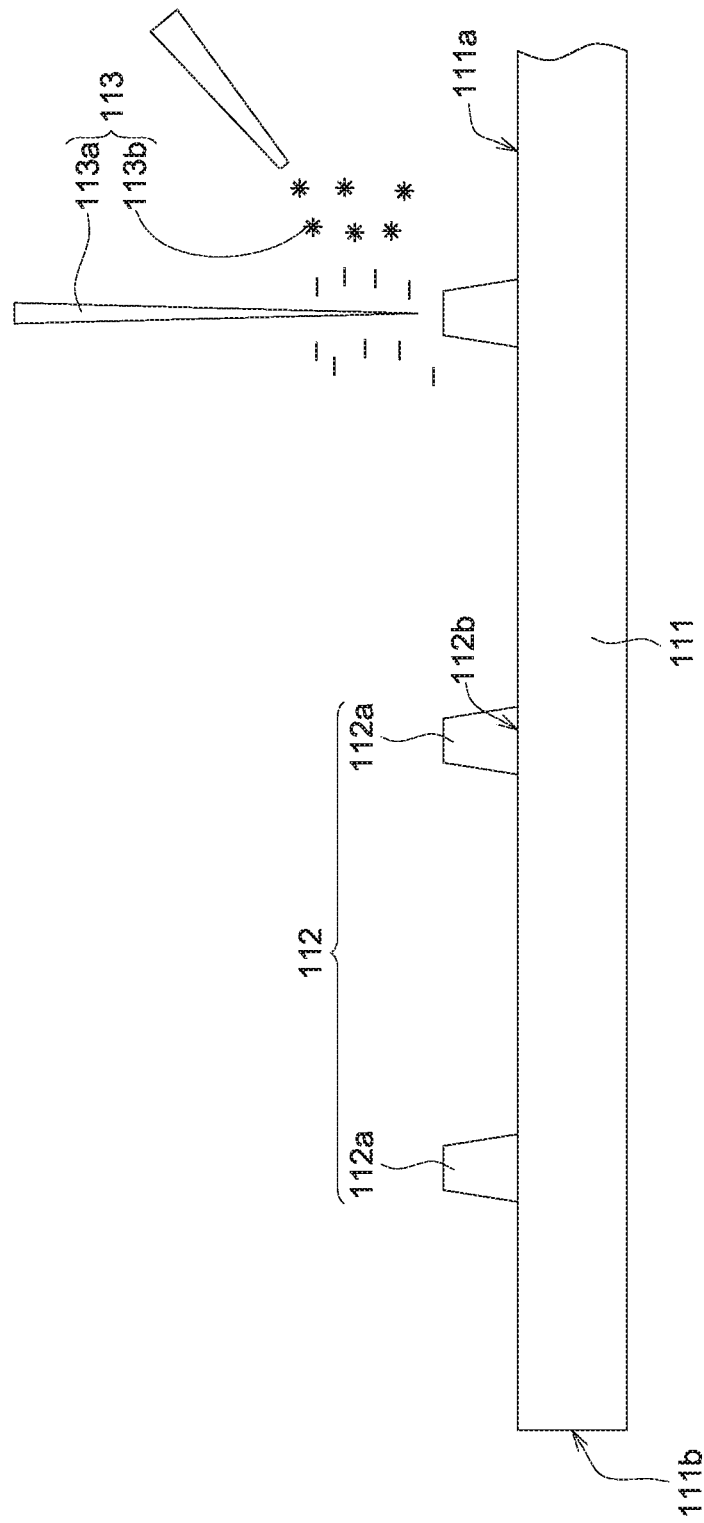

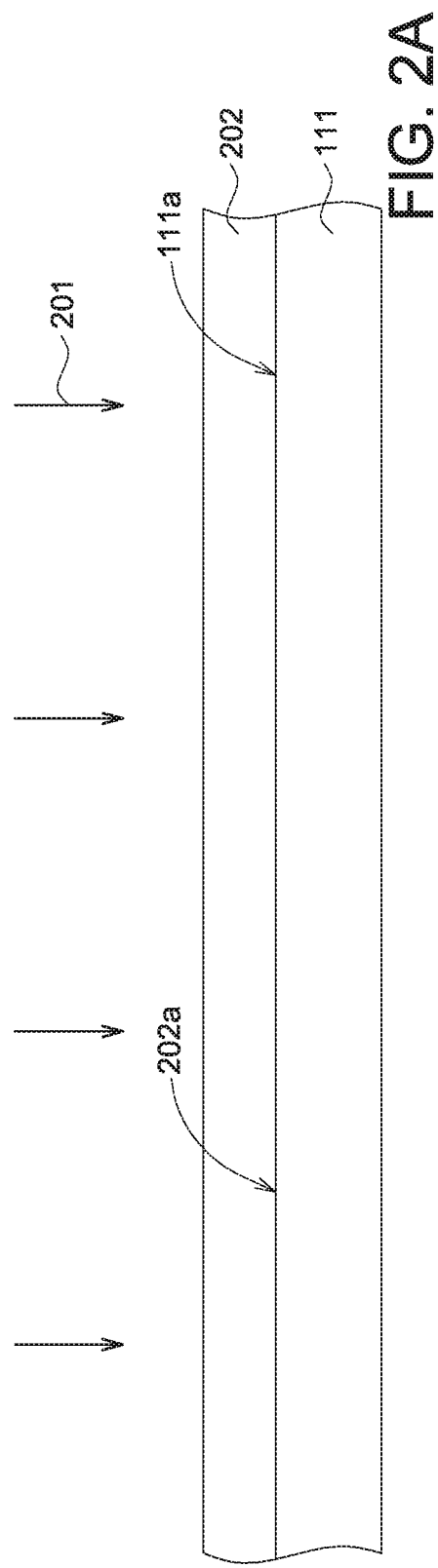
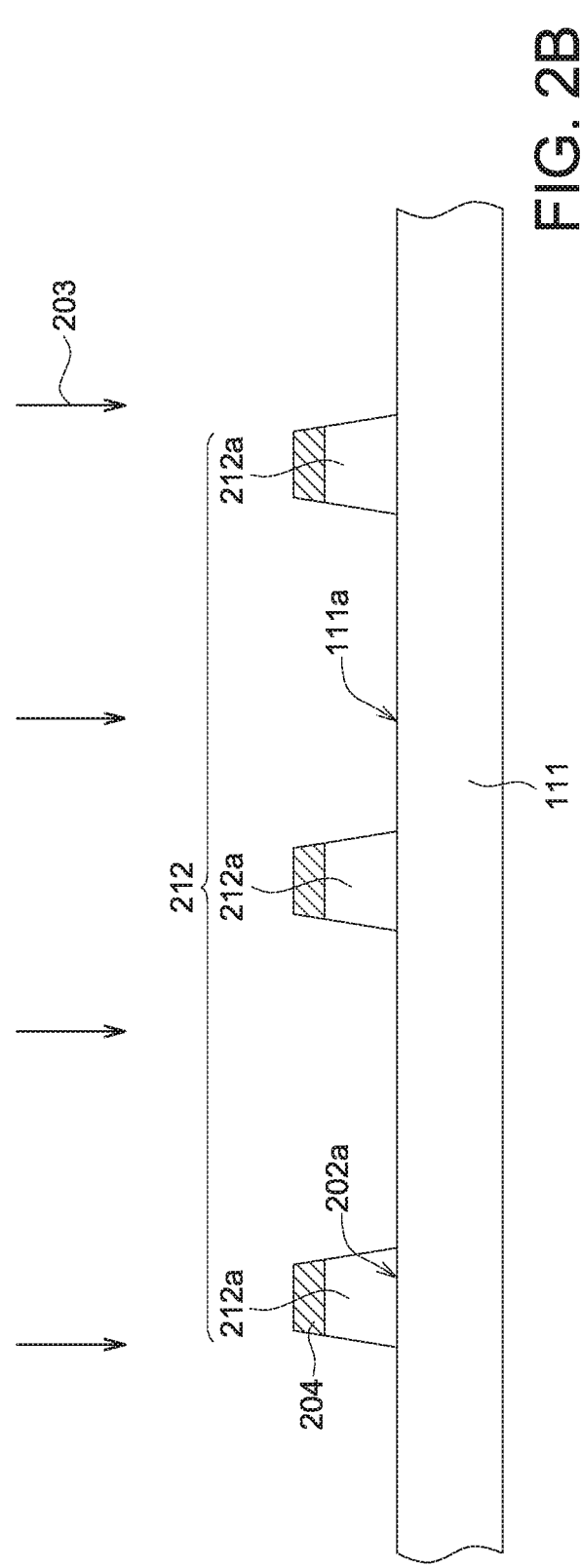

METHOD FOR MEASURING CHIPS BONDING STRENGTH AND CHIPS BONDING AUXILIARY STRUCTURE

This application claims the benefit of People's Republic of China application Serial No. 202010396124.1 filed May 12, 2020, the subject matter of which is incorporated herein by reference.

BACKGROUND

Technical Field

The disclosure relates to a method for fabrication semiconductor devices and the auxiliary structure thereof, and more particularly to a method for measuring the bonding strength of semiconductor chips and a chips bonding auxiliary structure.

Description of Background

Chip bonding technology refers to a method by which two semiconductor chips (for example, wafers) are cleaned and bonded together, and then subjected to a high temperature annealing treatment to form a chemical bond connection at the interface of these two semiconductor chips, has been widely used in the manufacturing process of semiconductor circuits (including substrate engineering, integrated circuit wiring, micro-electromechanical system (MEMS) and packaging technologies), and has become an important method for processing the composite materials to prepare integrated circuits and for fabricating micro-electromechanical structures.

In the chip bonding technology of the manufacturing process for forming the semiconductor circuits the bonding stress (bonding strength) is a very important manufacturing process parameter, which is an important part related to the quality of the manufacturing process. Insufficient bonding strength may cause a risk of chip peeling and cracking during processing, resulting in device failure. Therefore, after implementing the chip bonding step, it is necessary to measure and inspect the bonding strength on the bonded chip structure to ensure the yield and quality of the manufacturing process.

At present, the plug blade terminal strength method (also known as the blade-plug method) is commonly used to measure the bonding strength. During the measurement, a blade is inserted along the bonding interface between the two bonded chips by observing the fracture depth to estimate the bonding strength there between. Although this method requires relatively simple instruments and equipment, but it is still a destructive detection method. Furthermore, due to the brittle nature of the semiconductor chips, the step of inserting the blade into the bonded semiconductor chips requires operation of trained and experienced staff. The measured value may vary depending on the operator, and this may result in considerable measurement error.

Therefore, there is a need of providing an improved method for measuring chips bonding strength and a chips bonding auxiliary structure to obviate the drawbacks encountered from the prior art.

SUMMARY

One aspect of the present disclosure is to provide a method for measuring chips bonding strength, wherein the method includes steps as follows: An auxiliary pattern is formed on a first surface of a first chip, a second surface of a second chip is bonded to the first surface to form at least one gap space surrounding the auxiliary pattern. Next, dimensions of the at least one gap space and the auxiliary pattern are measure respectively; and the bonding strength between the first chip and the second chip is estimated according to the dimensions.

Another aspect of the present disclosure is to provide a chips bonding auxiliary structure, wherein the auxiliary structure includes a first chip, at least one auxiliary pattern, and a second chip. The first chip has a first surface. The auxiliary pattern is formed on the first surface. The second chip has a second surface bonded to the first surface for forming a gap space surrounding the auxiliary pattern.

In accordance with the embodiments of the present disclosure, a method for measuring chips bonding strength and a chips bonding auxiliary structure are provided. First, a convex or concave auxiliary pattern is formed on a bonding surface of one of the chips to be bonded, so that after another chip is bonded to the bonding surface a gap space surrounding the auxiliary pattern can be defined on the interface of these two bonded chips. The dimensions of the auxiliary pattern and the gap space can be measured by a non-destructive measurement methods (for example, an ultrasonic measurement, an optical measurement, or other suitable methods/techniques) to estimate the bonding strength of these two bonded chips based on the measured dimensions and the elastic modulus of these two bonded chips. Since measurement process does not damage the bonding structure of the bonded chips, thus the manufacturing process cost can be reduced. Meanwhile, it can eliminate the measuring variation due to human operation factors, thus the accuracy of measurement and estimation of the bonding strength can be improved.

BRIEF DESCRIPTION OF THE DRAWINGS

The above objects and advantages of the present disclosure will become more readily apparent to those ordinarily skilled in the art after reviewing the following detailed description and accompanying drawings, in which:

FIGS. 1A to 1E are cross-sectional views illustrating a series of the processing structure for fabricating a semiconductor device according to an embodiment of the present disclosure;

FIGS. 2A to 2B are cross-sectional views illustrating the processing structures for forming an auxiliary pattern on a carrier substrate by using another method according to another embodiment of the present disclosure.

DETAILED DESCRIPTION

Figure 1A:
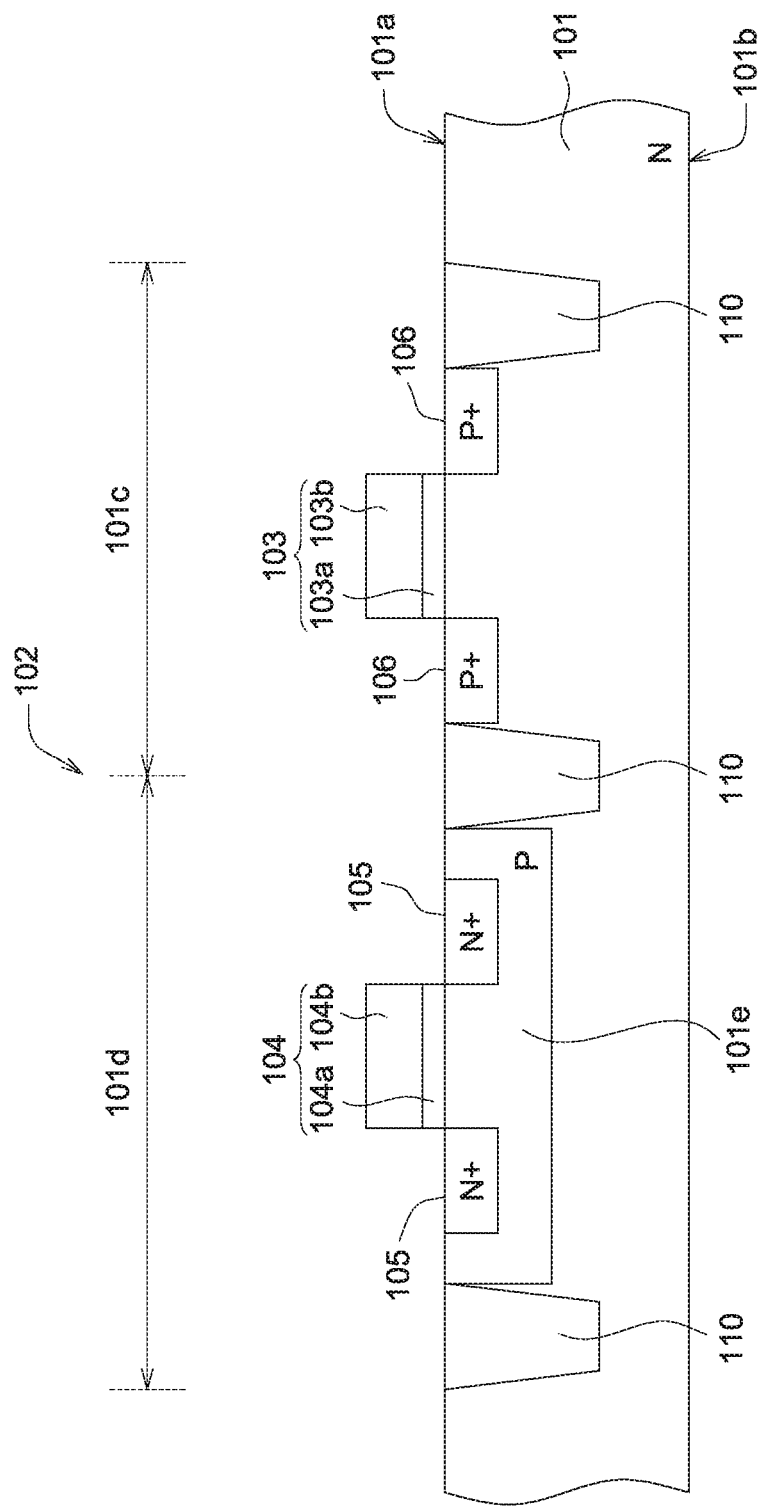

The embodiments as illustrated below provide a method for measuring chip bonding strength and a chips bonding auxiliary structure, which can achieve the purpose of reducing the manufacture cost, eliminating the measuring variation due to human operation, and improving the measurement accuracy. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is important to point out that there may be other features, elements, steps, and parameters for implementing the embodiments of the present disclosure which are not specifically illustrated. Thus, the descriptions and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

FIGS. 1A to 1E are cross-sectional views illustrating a series of the processing structure for fabricating a semiconductor device 100 according to an embodiment of the present disclosure. The method for fabricating the semiconductor device 100 includes steps as follows: firstly, a device substrate 101 is provided. In some embodiments of the present disclosure, the device substrate 101 may be a board, a chip, a wafer, a plate, a sheet or any type of films made of semiconductor materials, such as silicon (Si), germanium (Ge), or compound semiconductor materials, such as gallium arsenide (GaAs). In some other embodiments, the device substrate 101 can be a silicon-on-insulator (SOI) substrate. In the present embodiment, the device substrate 101 is a silicon substrate, such as a silicon chip.

Next, a front-end-of-line (FEOL) process is performed on a frontside surface 101a of the device substrate 101 for forming at least one semiconductor device 102 on the frontside surface 101a of the device substrate 101. The at least one semiconductor device 102 can be, for example, a transistor, a capacitor, a resistor, any other active/passive component, any microelectronic/micromechanical structure (not shown), or any combination thereof. In some embodiments of the present disclosure, the semiconductor device 102 may include a complementary metal-oxide semiconductor (CMOS) transistor.

Wherein, the FEOL process may include (but not limited to) steps as follows: The frontside surface 101a of the device substrate 101 can be clean and planarized using chemical-mechanical polishing (CMP) technology. Next, a shallow trench isolation (STI) structure 110 is formed in the device substrate 101 to divide the frontside surface 101a of the device substrate 101 into a first portion 101c and a second portion 101d. The first portion 101c of the frontside surface 101a of the device substrate 101 is covered with a patterned photoresist (not shown), and an ion implantation process is then performed on the frontside surface 101a of the device substrate 101 to form a P-type well region 101e in the second part 101d. Thereafter, a gate structure 103 including a gate dielectric layer 103a and a gate electrode 103b as well as a gate structure 104 including a gate dielectric layer 104a and a gate electrode 104b are respectively formed on the first portion 101c and the second portion 101d of the frontside surface 101a of the device substrate 101. After that, another ion implantation process using the gate structures 103 and 104 as masks is performed to form two n-type contact regions 105 (indicated as N+) in the p-type well region 101e, adjacent to the gate structure 104; two n-type contact regions 106 (indicated as P+) in the n-type device substrate 101 (indicated as N), adjacent to the gate structure 103, so as to implement the preparation of the CMOS transistor (semiconductor element 102) (see FIG. 1A).

Figure 1B:
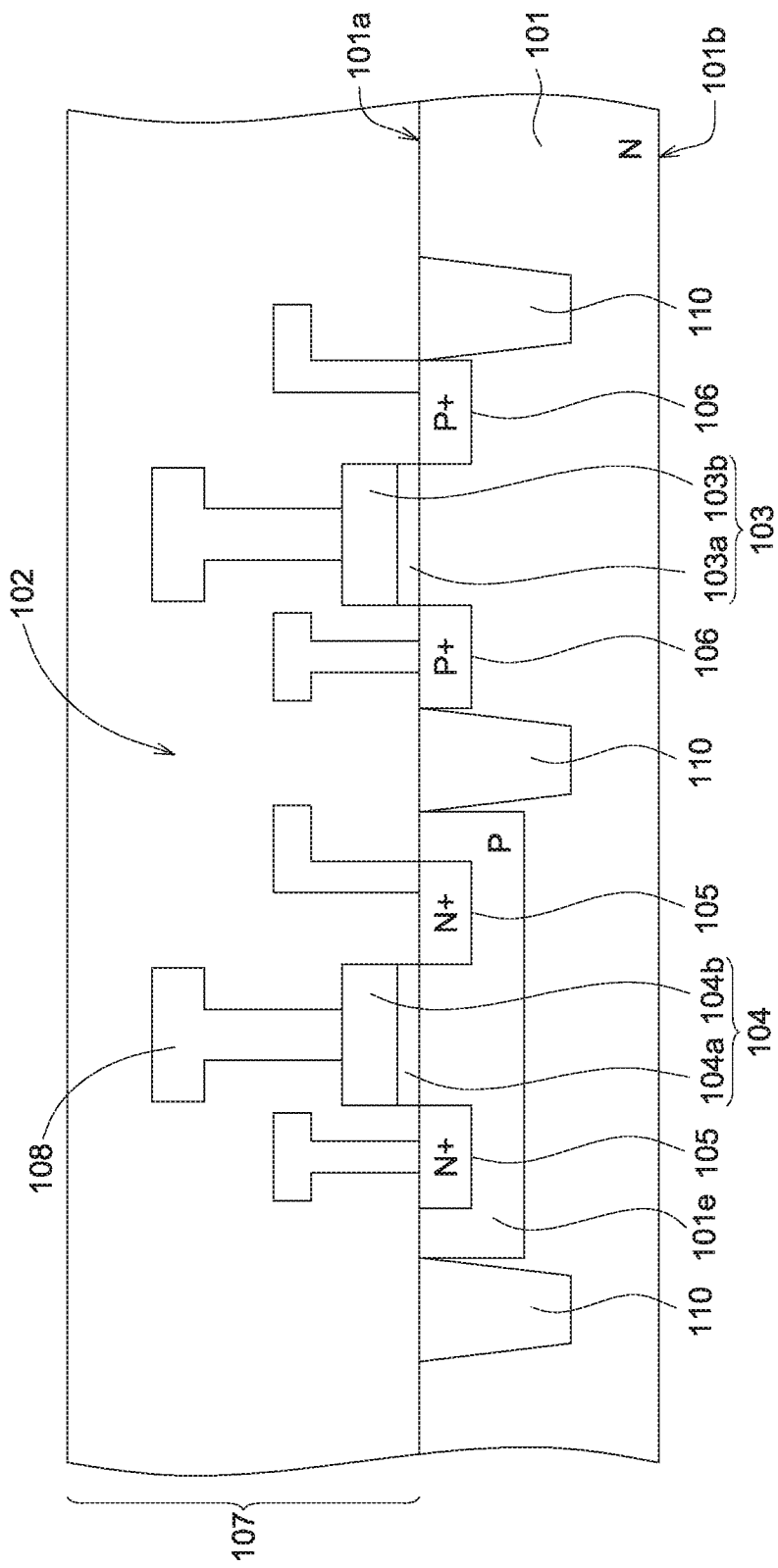

Subsequently, a back-end-of-line (BEOL) process is performed to form an interlayer dielectric layer (ILD) 107 on the semiconductor device 102, and an interconnection structure 108 in the ILD 107, wherein the interconnection structure 108 includes at least one metal layer electrically contacting with the gate structures 103 and 104, the n-type contact regions 105 and the p-type contact regions 106 respectively (as shown in FIG. 1B).

At the same time a carrier substrate 111 is provided, and an auxiliary pattern 112 is formed on a surface 111a of the carrier substrate 111. In some embodiments of the present disclosure, the carrier substrate 111 may be a board, a chip, a wafer, a plate, a sheet or any type of films made of semiconductor materials, such as Si, Ge, or compound semiconductor materials, such as GaAs. In some other embodiments, the carrier substrate 111 can be a SOI substrate. In the present embodiment, the carrier substrate 111 is also a silicon chip.

In some embodiments of the present disclosure, the auxiliary pattern 112 can be a deposited pattern layer. The method for forming the deposited pattern layer includes steps as follows: A focused ion beam (FIB) deposition process 113 is performed on the surface 111a of the carrier substrate 111, by which a charged particle beam 113 (or other energy beams) is applied to the surface 111a of the carrier substrate 111; tetraethoxysilane (TEOS) is used as a precursor mixed with the reaction gas 113b; the ion beam 113a can promote the cracking of the reaction gas 113b, and a plurality of silicon dioxide ($SiO_2$) convex pillars 112a are generated at predetermined positions on the surface 111a of the substrate 111. There is a boundary surface 112b between each convex pillars 112a and the surface 111a of the carrier substrate 111; and these convex pillars 112a constitute the auxiliary pattern 112 (as shown in FIG. 10).

In some embodiments of the present disclosure, the plurality of convex pillars 112a may be evenly distributed on the surface 111a of the carrier substrate 111. Alternatively, the convex pillars 112a may be concentrated on the center area of the surface 111a of the carrier substrate 111 or distributed adjacent to the edge 111b of the carrier substrate 111. Moreover, the size and shape of each convex pillars 112a may be the same or different. For example, in some other embodiments of the present disclosure, each of the convex pillars 112a may shapes as a cylinder, a cone, a polygonal columnar body, or a polygonal columnar body with other regular or irregular sides.

In the present embodiment, the plurality of convex pillars 112a may be evenly distributed on the surface 111a of the carrier substrate 111. Each of the convex pillars 112a is a cylinder of the same size. Each of the convex pillars 112a has a bottom area substantially ranging from 0.002 square millimeters ($mm^2$) to 0.03 $mm^2$. The height h of the convex pillars 112a may be the same or may be varied depending upon the changes of the arrangement position, and preferably ranges from 50 micrometer (μm) to 100 μm.

However, the method of making the auxiliary pattern is not limited to this regard. FIGS. 2A to 2B are cross-sectional views illustrating the processing structures for forming an auxiliary pattern 212 on the surface 111a of the carrier substrate 111 by using another method according to another embodiment of the present disclosure. In the present embodiment, the formation of the auxiliary pattern 212 includes the following steps: First, a deposition process 201 is performed to form a deposition layer 202 on the surface 111a of the carrier substrate 111, wherein the deposition layer 202 contacts to the surface 111a of the carrier substrate 111 to form a deposition interface 202a there between.

Next, a photoresist etching process 203 is performed, using a patterned photoresist layer 204 as an etching mask, to remove a portion of the deposited layer 202, thus to form a plurality of convex pillars 212a on the surface 111 a of the carrier substrate 111. Each of the convex pillars 212a is located at a predetermined position respectively, and the convex pillars 212a constitute the auxiliary patterns 212.

In the present embodiment, the convex pillars 212a constituting the auxiliary pattern 212 and the convex pillars 112a constituting the auxiliary pattern 112 may have the same structural appearance, size, and distribution position but do not formed by the same manufacturing method. In another embodiment of the present disclosure, the auxiliary patterns 112 and 212 may be formed by different methods and arranged at different positions on the surface 111a of the supporting substrate 111.

Figure 1D:
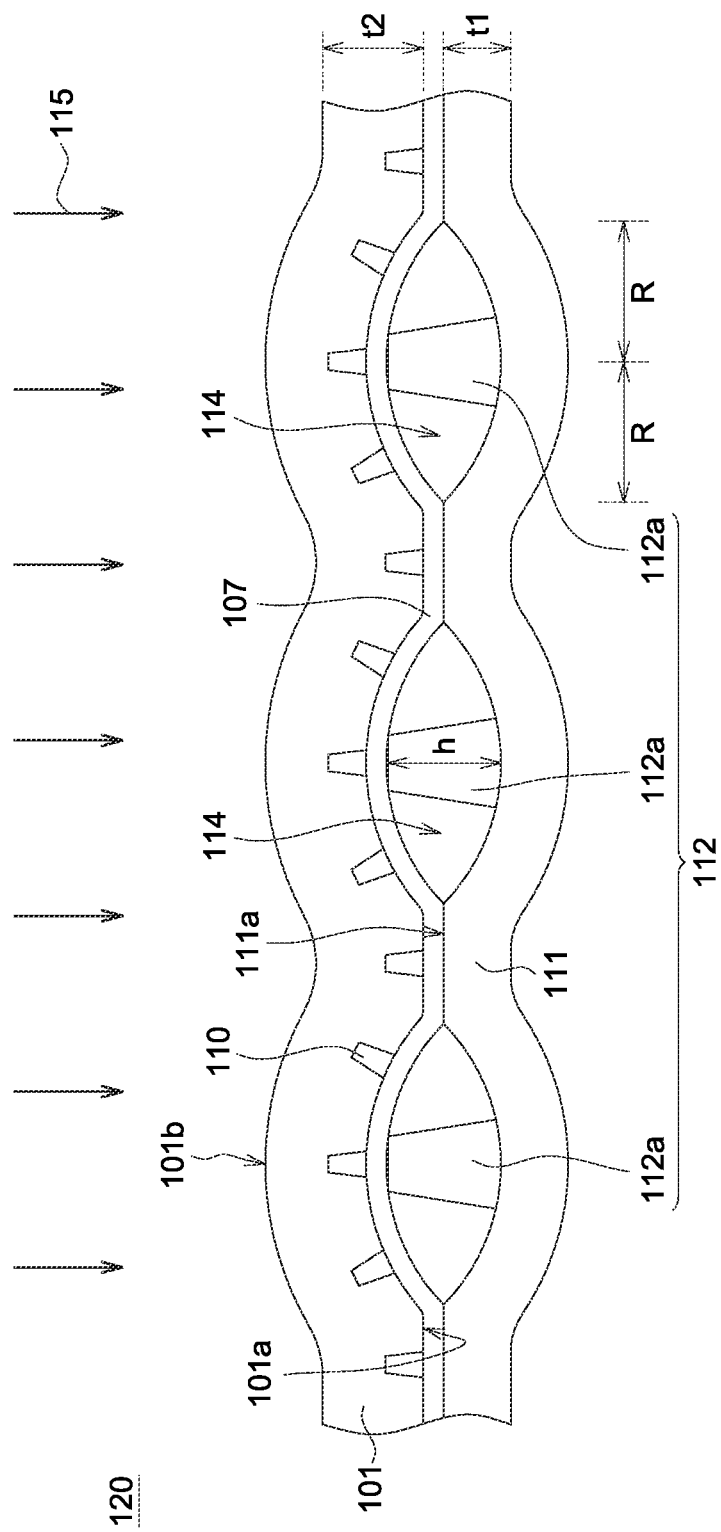

After the forming of the auxiliary pattern 112, the device substrate 101 and the carrier substrate 111 are bonded to form a bonding auxiliary structure 120 (as shown in FIG. 1D). In the present embodiment, the way of bonding the device substrate 101 with the carrier substrate 111 is to make the frontside surface 101a of the device substrate 101 and the surface 111 a of the carrier substrate 111 face each other. Meanwhile, a force perpendicular to the frontside surface 101a of the device substrate 101 and the surface 111a of carrier substrate 111 is applied to bring the ILD 107 disposed on the frontside surface 101a of the device substrate 101 into contact with the surface 111a of the carrier substrate 111 to make them bonded together.

Because the convex pillars 112a can held open a gap between the ILD 107 of the device substrate 101 and the surface 111a of the carrier substrate 111. The tops of the plurality of convex pillars 112a of the auxiliary pattern 112 are in contact with a portion of the ILD 107 of the device substrate 101; and the portions of the surface 111a of the carrier substrate 111 near the bottoms of the convex pillars 112a may be separated from the ILD 107 of the device substrate 101. Thus, a plurality of gap spaces 114 can be defined between the frontside surface 101a of the device substrate 101 and the surface 111a of the carrier substrate 111, and each of the gap spaces 114 correspondingly surrounds a portion of the convex pillars 112a of the auxiliary pattern 112. In the following drawings, the semiconductor element 102 and the interconnection structure 108 may be omitted for the purpose of clear description.

For example, in some embodiments of the present disclosure, each of the gap spaces 114 correspondingly surrounds one of the convex pillars 112a. Alternatively, in some other embodiments, each of the gap spaces 114 correspondingly surrounds several of the convex pillars 112a. Each of the gap spaces 114 has a projected area (indicated as an average radius R) projected on the frontside surface 101a of the device substrate 101 or the surface 111 a of the carrier substrate 111, which is substantially ranging from 500 mm$^2$ to 1000 mm$^2$.

Figure 3:
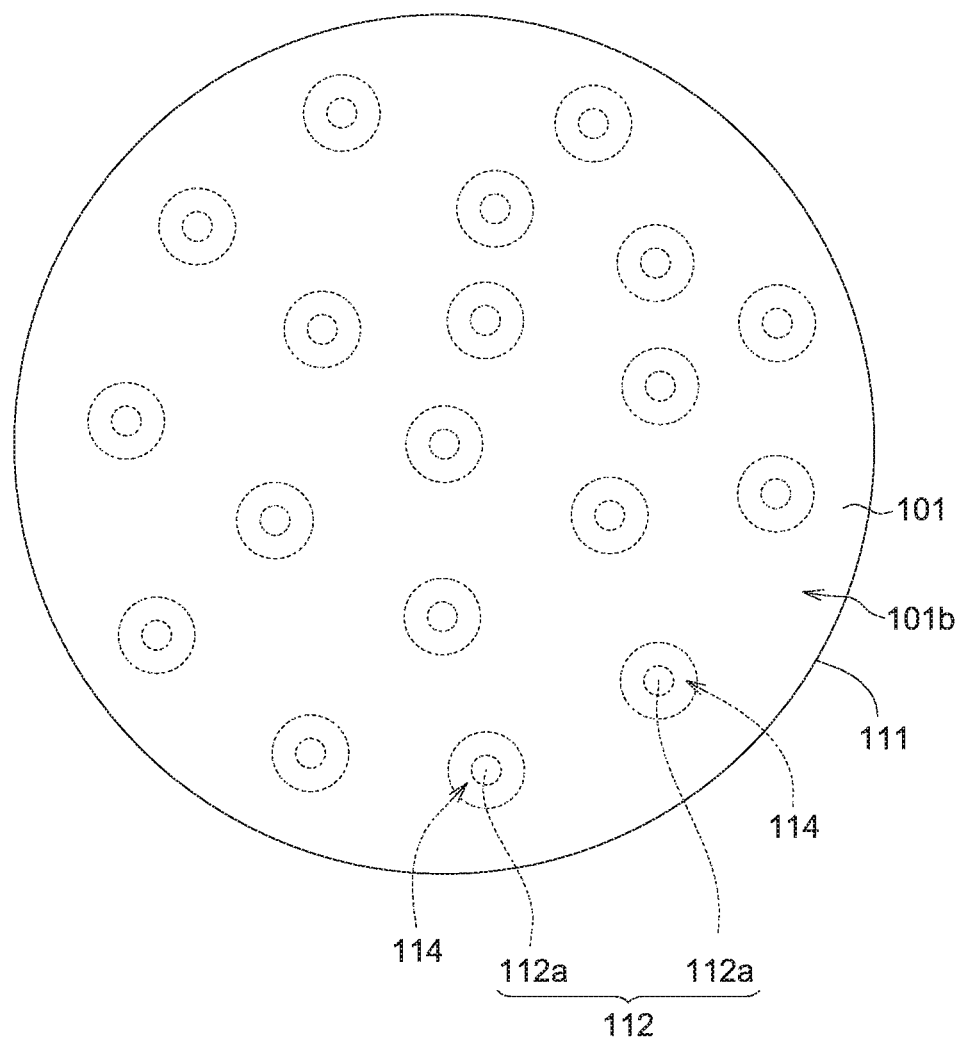
FIG. 3 is a top view illustrating the chip bonding auxiliary structure shown in FIG. 1D.

FIG. 3 is a top view illustrating the chip bonding auxiliary structure 120 shown in FIG. 1D. In the present embodiment, the convex pillars 112a of the auxiliary pattern 112 are evenly distributed on the surface 111a of the carrier substrate 111. Each of the gap spaces 114 is a circular chamber, correspondingly surrounding or accommodating one of the convex pillars 112a, and the surrounded convex pillar 112a is located at the center of the corresponding gap space 114.

In some embodiments of the present disclosure, after the device substrate 101 and the carrier substrate 111 are bonded to form the chip bonding auxiliary structure 120, a thermal annealing process 115 may be optionally performed on the bonded device substrate 101 and the carrier substrate 111, in which the high temperature may trigger a physicochemical reaction occurring between the interlayer dielectric layer 107 of the device substrate 101 and the surface 111a of the carrier substrate 111 to form a chemical bond connection at the bonding interface thereof, and thus to make the chip bonding auxiliary structure 120 more stable.

Next, dimensions of the gap space 114 and the auxiliary pattern 112 are measure respectively; and the bonding strength between the device substrate 101 and the carrier substrate 111 is estimated according to the dimensions. In some embodiments of the present disclosure, the method for measuring the dimensions of the gap space 114 and the auxiliary pattern 112 includes using an ultrasonic measurement method or an optical measurement method to measure the average radius R of the plurality of gap spaces 114, the average height h of the plurality of convex pillars 112a, the thickness t1 of the carrier substrate 111 and the thickness t2 of the device substrate 101.

Wherein, the ultrasonic measurement includes the use of a confocal scanning acoustic microscopy (CSAM), which can display the tiny structures inside the object by using the differences in the acoustic characteristics of the object (for example, acoustic impedance and acoustic attenuation). Such that, the acoustic images, or elastic images of objects to be measured can be obtain without direct light transmission and without damaging the object. The optical measurement includes the use of a laser triangulation technique, which uses one or more laser lines to scan the surface curvature of the object to be measured, and uses basic geometric operations to obtain the distance of a third point from the positions of two known points. Since these two methods both belong to non-contact measurement methods, and have the advantages of non-destructive, non-contact, fast and convenient instrument erection, thus can greatly reduce the inspection cost, and at the same time can avoid the problem of poor measurement quality caused by the interference of human operation factors in the prior art technology (for example, the plug blade terminal strength method).

In some embodiments of the present disclosure, the modulus of elasticity E1 of the carrier substrate 111 and the modulus of elasticity E2 of the device substrate 101 can be taken into account for estimating the bonding strength γ, in addition to referring to the measured average radius R of the gap spaces 114, the average height h of the convex pillars 112a, the thickness t1 of the carrier substrate 111, and the thickness t2 of the device substrate 101.

For example, in the present embodiment, the Young's modulus can be used to estimate the bonding strenth γ between the carrier substrate 111 and the device substrate 101, where the Young's modulus is as in Formula (I):

$$R = \left[ \frac{4}{3} \frac{E_1^* t_1^3 E_2^* t_2^3}{\gamma(E_1^* t_1^3 + E_2^* t_2^3)} \right]^{1/4} h^{1/2} \qquad \text{Formula (I)}$$

As a result of the estimation, the bonding strenth γ between the carrier substrate 111 and the device substrate 101 may substantially range from 1 Joule/square meter (J/m$^2$) to 4 J/m$^2$.

It should be appreciated that although the present embodiment uses Formula (I) to estimate the bonding strenth γ of the particular chip bonding structure that each gap space 114 corresponds to single one convex pillar 112a. However, those people with ordinary skill in the art can still adjust the elastic modulus used to calculate the bonding strength γ depending upon the difference of the auxiliary patterns 112 (for example, the number or distribution of the plurality of convex pillars 112a) and the changes of the relative configuration or parameter range of the auxiliary patterns 112 and the gap space 114; and different calculation formulas can be even used to estimate the bonding strength γ between the carrier substrate 111 and the device substrate 101.

Figure 1E:
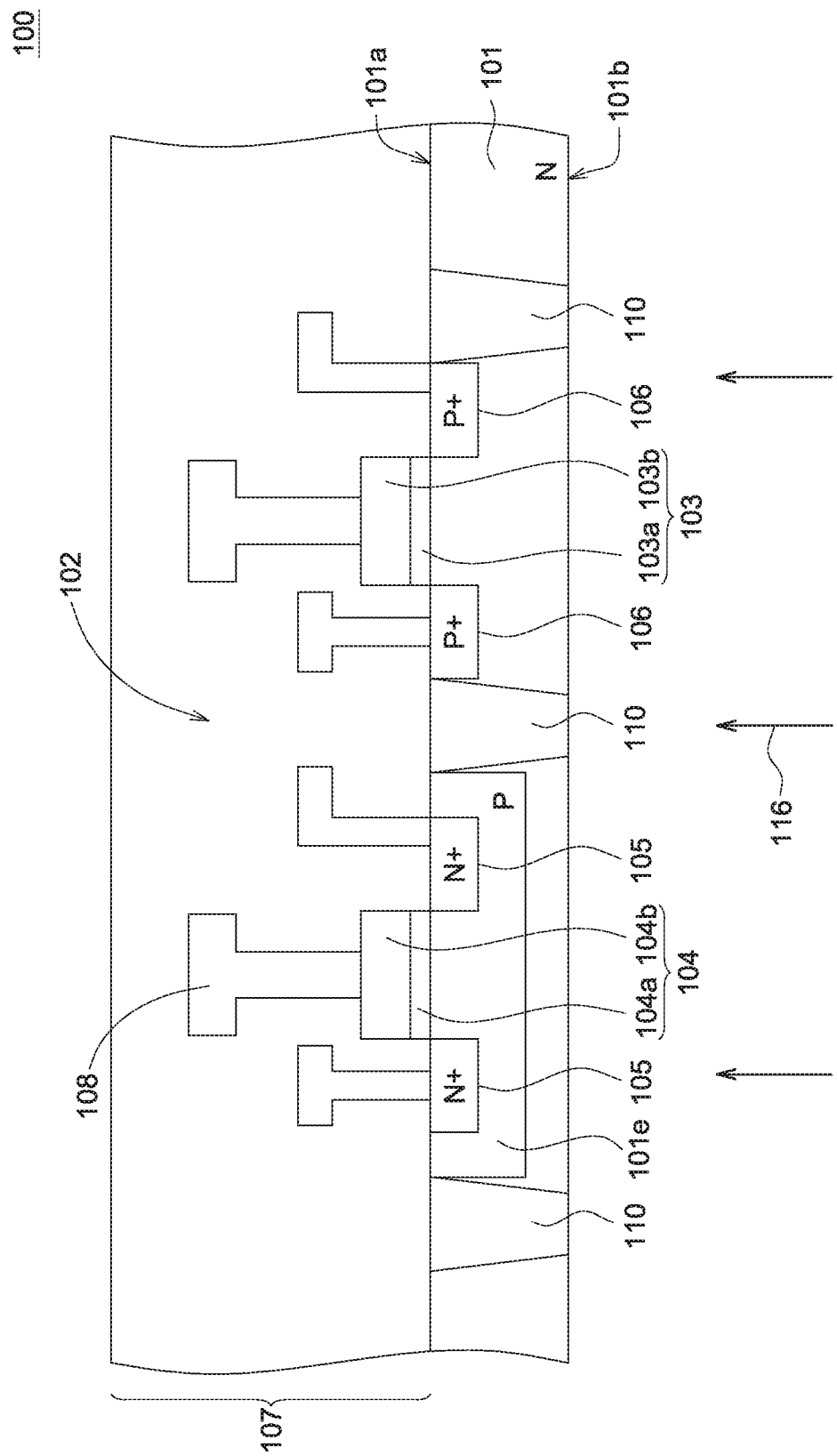

When the bonding strenth γ between the device substrate 101 and the carrier substrate 111 meets the manufacturing process standard, a thinning process 116 is performed on the rear surface 101b of the device substrate 101 to remove a portion of the device substrate 101 to make a portion of the shallow trench isolation structure 110 exposed (as shown in FIG. 1E).

Subsequently, the carrier substrate 111 is removed, and a downstream process, such as a metal damascene process, is performed on the rear surface 101b of the device substrate 101 to form metal interconnect structure (not shown) on the rear surface 101 b of the device substrate 101, meanwhile the preparation of the semiconductor device (transistor device) 100 as shown in FIG. 1E can be implemented. The removed carrier substrate 111 can be reused after cleaning and recycling.

In accordance with the embodiments of the present disclosure, a method for measuring chips bonding strength and a chips bonding auxiliary structure are provided. First, a convex or concave auxiliary pattern is formed on a bonding surface of one of the chips to be bonded, so that after another chip is bonded to the bonding surface a gap space surrounding the auxiliary pattern can be defined on the interface of these two bonded chips. The dimensions of the auxiliary pattern and the gap space can be measured by a non-destructive measurement methods (for example, an ultrasonic measurement, an optical measurement, or other suitable methods/techniques) to estimate the bonding strength of these two bonded chips based on the measured dimensions and the elastic modulus of the these two bonded chips. Since measurement process does not damage the bonding structure of the bonded chips, thus the manufacturing process cost can be reduced. Meanwhile, it can eliminate the measuring variation due to human operation factors, thus the accuracy of measurement and estimation of the bonding strength can be improved.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for measuring chips bonding strength, comprising:
   forming an auxiliary pattern on a first surface of a first chip;
   bonding a second surface of a second chip to the first surface to form at least one gap space surrounding the auxiliary pattern;
   measuring dimensions of the at least one gap space and the auxiliary pattern respectively; and
   estimating the bonding strength between the first chip and the second chip according to the dimensions.

2. The method according to claim 1, wherein the step of forming the auxiliary pattern comprises:
   performing a deposition process to form a deposition layer on the first surface, wherein a boundary surface is formed between the deposition layer and the first surface; and
   performing an etching process to remove a portion of the deposition layer, to form a patterned layer.

3. The method according to claim 1, wherein the step of forming the auxiliary pattern comprises performing a focused ion beam (FIB) deposition process on the first surface to form a deposition patterned layer.

4. The method according to claim 1, wherein the auxiliary pattern comprises a plurality of convex pillars; the at least one gap space comprises a plurality of gap spaces; and
   each of the plurality of gap spaces correspondingly surrounds single one of the plurality of convex pillars.

5. The method according to claim 4, wherein the estimating the bonding strength is estimated according to dimensions of the plurality of gap spaces and the modulus of elasticities of the first chip and the second chip.

6. The method according to claim 5, wherein the step of estimating the bonding strength comprises:
   obtaining a thickness t1 of the first chip, a modulus of elasticity E1 of the first chip, a thickness t2 of the second chip, a modulus of elasticity E2 of the second chip, an average height h of the plurality of convex pillars, and an average radius R of the plurality of gap spaces; and
   calculating the bonding strenth γ using a Formula (I) as follows:

$$R = \left[\frac{4}{3} \frac{E_1^* t_1^3 E_2^* t_2^3}{\gamma(E_1^* t_1^3 + E_2^* t_2^3)}\right]^{1/4} h^{1/2}. \qquad \text{Formula (I)}$$

7. The method according to claim 6, wherein each of the plurality of convex pillars has a bottom area substantially ranging from 0.002 square millimeters (mm$^2$) to 0.03 mm$^2$; the average height h ranges from 50 micrometer (μm) to 100 μm; and each of the plurality of gap spaces has a projected area ranging from 500 mm$^2$ to 1000 mm$^2$.

8. The method according to claim 1, wherein the auxiliary pattern comprises a plurality of convex pillars; the at least one gap space comprises a plurality of gap spaces; and each of the plurality of gap spaces correspondingly surrounds several ones of the plurality of convex pillars.

9. The method according to claim 1, wherein the step of measuring the dimensions of the at least one gap space and the auxiliary pattern comprises an ultrasonic measurement or an optical measurement.

10. The method according to claim 9, wherein the ultrasonic measurement comprises using of a confocal scanning acoustic microscopy (CSAM).

11. The method according to claim 9, wherein the optical measurement comprises using of a laser triangulation technique.

12. The method according to claim 1, further comprising a thermal annealing process performed prior to the step of measuring the dimensions of the at least one gap space and the auxiliary pattern.

* * * * *